United States Patent
Meissl et al.

(10) Patent No.: US 11,104,057 B2
(45) Date of Patent: Aug. 31, 2021

(54) IMPRINT APPARATUS AND METHOD OF IMPRINTING A PARTIAL FIELD

(71) Applicant: CANON KABUSHIKI KAISHA, Tokyo (JP)

(72) Inventors: Mario Johannes Meissl, Austin, TX (US); Wei Zhang, Austin, TX (US); Byung-Jin Choi, Austin, TX (US); Zhengmao Ye, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 482 days.

(21) Appl. No.: 15/010,774

(22) Filed: Jan. 29, 2016

(65) Prior Publication Data
US 2017/0165898 A1    Jun. 15, 2017

Related U.S. Application Data

(60) Provisional application No. 62/266,455, filed on Dec. 11, 2015.

(51) Int. Cl.
*B29C 59/02* (2006.01)
*G03F 7/00* (2006.01)
*B29C 35/02* (2006.01)
*B29C 37/00* (2006.01)
*B29C 59/00* (2006.01)

(52) U.S. Cl.
CPC ............ *B29C 59/021* (2013.01); *B29C 35/02* (2013.01); *B29C 37/0003* (2013.01); *B29C 59/002* (2013.01); *G03F 7/0002* (2013.01)

(58) Field of Classification Search
CPC ... B29C 35/02; B29C 37/0003; B29C 59/002; G03F 7/002
See application file for complete search history.

(56) References Cited

U.S. PATENT DOCUMENTS

| 6,873,087 B1 | 3/2005 | Choi et al. |
| 7,635,263 B2 | 12/2009 | Cherala et al. |

(Continued)

FOREIGN PATENT DOCUMENTS

| CN | 102173238 A | 9/2011 |
| CN | 102203672 A | 9/2011 |

(Continued)

*Primary Examiner* — Michael M. Robinson
(74) *Attorney, Agent, or Firm* — Abel Schillinger, LLP

(57) ABSTRACT

In an embodiment, an imprint apparatus can include a substrate holder having a chucking region and a recessed support section; and a template holder, wherein the chucking region has more area as compared to a template region. In another embodiment, an imprint apparatus can include gas zones; and a gas controller that can be configured to adjust pressures within the gas zones to induce a convex curvature of a partial field of a workpiece used with the imprint apparatus. A method can include providing a workpiece within an imprint apparatus, wherein the workpiece includes a substrate and a formable material; and initially contacting a template with the formable material at a location spaced apart from the periphery of a partial field. In a particular embodiment, the method can further include modulating the substrate to form a convex shape contacting the template with the formable material.

14 Claims, 10 Drawing Sheets

(56) References Cited

U.S. PATENT DOCUMENTS

| | | |
|---|---|---|
| 7,727,453 B2 | 6/2010 | Sreenivasan et al. |
| 7,802,978 B2 | 9/2010 | Sreenivasan et al. |
| 7,882,780 B2 | 2/2011 | Sewell |
| 8,215,946 B2 | 7/2012 | GanapathiSubramanian et al. |
| 8,865,046 B2 | 10/2014 | Sreenivasan et al. |
| 8,913,230 B2 | 12/2014 | GanapathiSubramanian et al. |
| 2004/0146792 A1 | 7/2004 | Nimmakayala et al. |
| 2009/0086187 A1* | 4/2009 | Compen ............. G03F 7/707 355/73 |
| 2010/0072652 A1* | 3/2010 | GanapathiSubramanian ............. B82Y 10/00 264/101 |
| 2011/0001954 A1* | 1/2011 | GanapathiSubramanian ............. B82Y 10/00 355/72 |
| 2015/0091230 A1 | 4/2015 | Ganapathisubramanian et al. |
| 2015/0158240 A1 | 6/2015 | Haase et al. |
| 2015/0183151 A1 | 7/2015 | GanapathiSubramanian et al. |

FOREIGN PATENT DOCUMENTS

| | | |
|---|---|---|
| CN | 104122746 A | 10/2014 |
| JP | 2001185607 A | 7/2001 |
| JP | 2006510223 A | 3/2006 |
| JP | 2012-532448 A | 12/2012 |
| JP | 2012532448 A | 12/2012 |
| JP | 2015-050437 A | 3/2015 |
| JP | 2015201556 A | 11/2015 |
| WO | 2015155988 A1 | 10/2015 |

\* cited by examiner

IMPRINT APPARATUS AND METHOD OF IMPRINTING A PARTIAL FIELD

CROSS-REFERENCE TO RELATED APPLICATIONS

The present application claims priority to U.S. Provisional Patent Application No. 62/266,455, filed Dec. 11, 2015, entitled "IMPRINT APPARATUS AND METHOD OF IMPRINTING A PARTIAL FIELD", naming as inventors Mario Johannes Meissl et al., which is incorporated by reference herein in its entirety.

FIELD OF THE DISCLOSURE

The present disclosure relates to imprint apparatuses and methods of using the imprint apparatuses to imprint partial fields.

RELATED ART

Imprint apparatuses can be used to form patterns with small geometries (for example, less than 1000 nm) within a formable material. A full field or a partial field may be imprinted. A full field is a field in which all of an imprinting field of a template overlies all of a substrate and its corresponding overlying formable material. A partial field is a field in which only part and not all of an imprinting field of a template overlies the substrate or a portion of substrate where edge effects of the substrate are significant, for example, over a portion of the substrate that has a contoured (rounded) edge. While imprinting any field may be challenging, imprinting a partial field can be particularly challenging. Improved imprinting of partial fields is desired.

BRIEF DESCRIPTION OF THE DRAWINGS

Embodiments are illustrated by way of example and are not limited in the accompanying figures.

Figure 1:
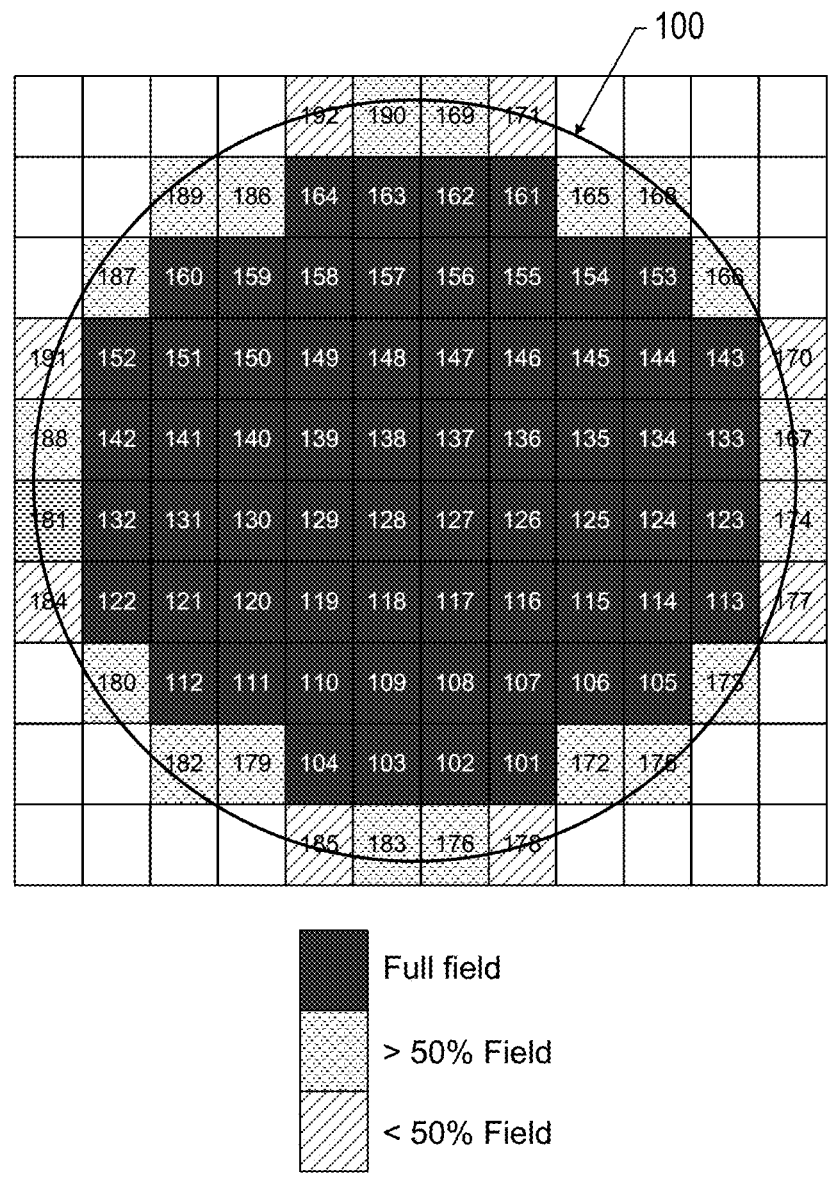
FIG. 1 includes a top view of a substrate in relation to imprint fields.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

As used herein, all pressures are gauge pressures unless explicitly stated to the contrary. Thus, negative pressure is less than atmospheric pressure and is referred to as vacuum pressure. Positive pressure is higher than atmospheric pressure. For this specification, values for pressure are deemed greater as they deviate more from atmospheric pressure. Hence, −50 kPa is greater than −3 kPa.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the words "approximately", "substantially", or "about", mean that a value of an element has a parameter that is expected to be close to a stated value or position.

However, as is well known in the art there are always minor variations that prevent the values or positions from being exactly as stated. It is well established in the art that variances of up to at least ten percent (10%) are reasonable variations from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

An imprint apparatus and method of using the apparatus as described herein are well suited for imprinting all imprint fields, including partial fields. Partial fields are of particular interest in the semiconductor industry, particularly as the size of the substrate becomes larger, such as 300 mm diameter and larger semiconductor wafers. Partial fields in general refer to imprint fields, typically at or near the substrate's edge, that have less than the full area that could otherwise be imprinted by the entire patterning surface (i.e., imprint field) of the imprint template, which may also referred to as a mold. Imprinting partial fields can increase the percentage of a substrate that can yield electronic devices. Partial fields can be classified into two further sub-categories based on the area of the imprint field that overlaps the substrate, namely, (i) fields with more than 50% area coverage (>50% partial fields), and (ii) fields with less than 50% area coverage (<50% partial fields). FIG. 1 includes an illustration to illustrate the relationship between a substrate 100 and imprint fields 101 to 192. Imprint fields 101 to 164 are full fields; imprint fields 65 to 69, 72 to 76, 78, 80 to 83, and 86 to 90 are >50% partial fields; and imprint fields 70, 71, 77, 79, 84, 85, 91, and 92 are <50% partial fields. Imprinting on partial fields poses a unique challenge in that sub-portions of the patterning surface (i.e., imprint field) on the template are positioned into close proximity with the substrate without the presence of formable material (i.e., imprint fluid) being entirely present between the template and the substrate.

The apparatus and method allow initial contact of a template with a formable material to be at a location spaced apart from a peripheral edge of the partial field. In a particular embodiment, the initial contact may be targeted to occur at the geometric center of a particular imprint field, whether such particular imprint field is a full field, a >50% partial field, or even a <50% partial field. The apparatus and method are designed to allow initial contact with an imprint field at or at near the geometric center of the imprint field. In an embodiment, the substrate surface can be modulated to achieve a convex surface at where initial contact occurs. Such modulation can be beneficial for partial fields, and particularly, <50% partial fields. The method can help with allowing the formable material to spread in the partial more like a full field imprinting, as compared to partial field printing without the convex surface.

In an embodiment, an imprint apparatus can include a substrate holder including a chucking region and a recessed support section adjacent to a periphery of the chucking region, wherein the chucking region has a chucking region area. The imprint apparatus can include a template holder having a template region for a template, wherein the template region has a template region area. The chucking region area can be larger than the patterning area of the template, which can correspond to the area of a full field.

In another embodiment, an imprint apparatus can include a substrate holder including a chucking region for a substrate and zones as defined by chucking lands, extending to an exposed surface of the chucking region. The imprint apparatus can further include a gas controller for the zones that controls gas pressure within the zones, wherein the gas controller is configured to adjust pressures within the zones to induce a convex curvature of a partial field of a substrate used with the imprint apparatus.

In a further embodiment, a method can include providing a workpiece within an imprint apparatus, wherein the workpiece includes a substrate and a formable material overlying the substrate. The method can further include contacting a template with the formable material within a partial field having a periphery, wherein contacting includes initially contacting the template with the formable material at a location spaced apart from the periphery of the partial field. In a particular embodiment, the method can include modulating the substrate to form a convex shape of the substrate adjacent to a periphery of the substrate before contacting the template with the formable material.

Figure 2:
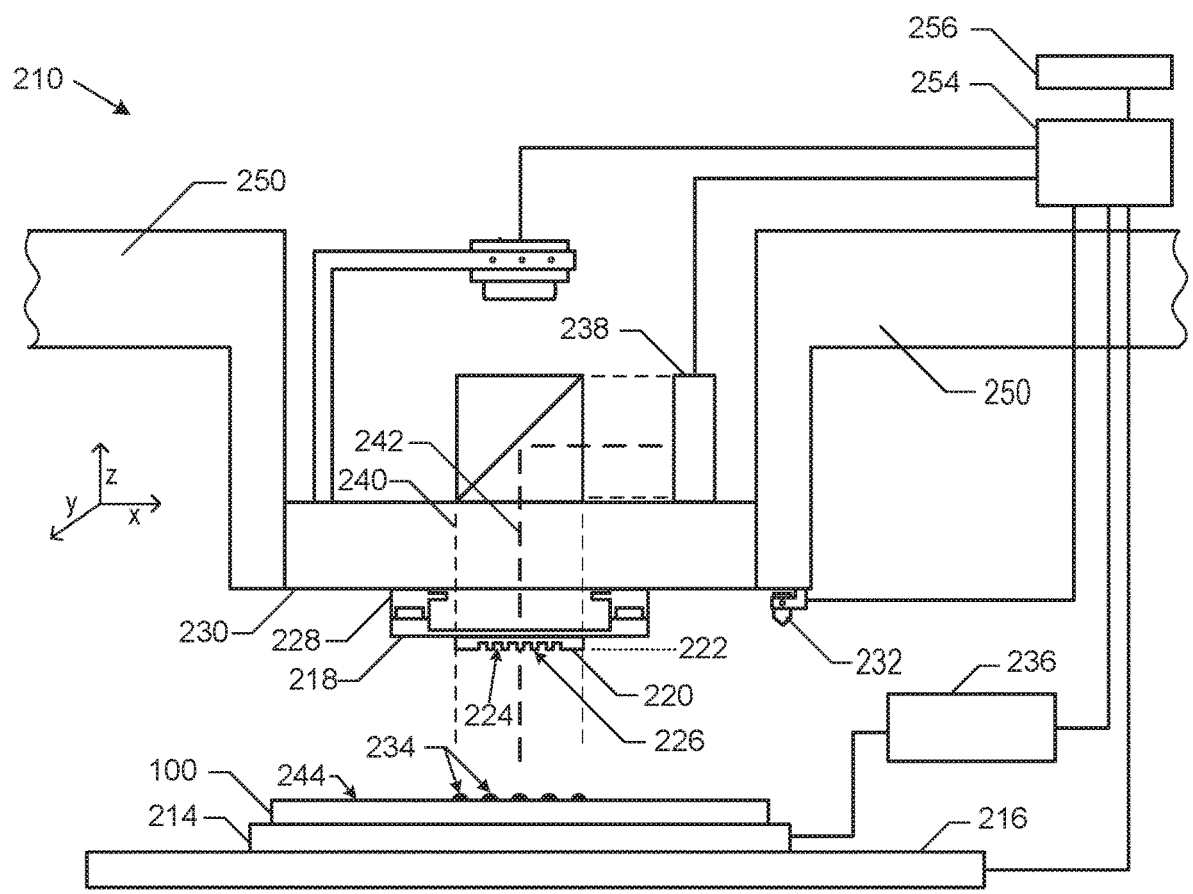
FIG. 2 includes a conceptual view of an imprint apparatus.

FIG. 2 illustrates a nanoimprint lithography system 210 that can be used to form a relief pattern on the substrate 100. The substrate 100 can be coupled to a substrate chuck 214. As illustrated, the substrate chuck 214 is a vacuum chuck. The substrate chuck 214, however, may be any chuck including vacuum, pin-type, groove-type, electrostatic, electromagnetic, and/or the like. Exemplary chucks are described in U.S. Pat. No. 6,873,087, which is hereby incorporated by reference herein in its entirety.

The substrate 100 and substrate chuck 214 can be further supported by a stage 216. The stage 216 can provide translational motion, rotational motion, or both translational and rotational motion along the x, y, and z-axes. The stage 216, the substrate 100, and the substrate chuck 214 may also be positioned on a base (not illustrated).

A template 218 is spaced-apart from the substrate 100. The template 218 can include a body having opposing sides with one of the opposite sides having a mold 220, which corresponds to in size to a full field, having a patterning surface 222 extending therefrom towards the substrate 100. In an embodiment, the mold 220 can be in the form of a mesa. In another embodiment, the template 218 does not include the mesa.

In an embodiment, the template 218, the mold 220, or both are formed from a material including fused-silica, quartz, silicon, an organic polymer, a siloxane polymer, borosilicate glass, a fluorocarbon polymer, metal, hardened sapphire, another suitable material that can be molded, machined, or etched into a desired shape, or any combination thereof. As illustrated, the patterning surface 222 includes features defined by a plurality of spaced-apart recesses 224, protrusions 226, or any combination of recesses and protrusions, though embodiments of the present invention are not limited to such configurations. In an alternative embodiment, the patterning surface has a planar surface. The patterning surface 222 defines a pattern that forms the basis of a corresponding pattern to be formed on the substrate 100.

In the illustrated embodiment, the template 218 is coupled to a template chuck 228. The template chuck 228 may be configured as a vacuum, pin-type, groove-type, electrostatic, electromagnetic, another suitable chuck type, or any combination thereof. Exemplary chucks are further described in U.S. Pat. No. 6,873,087. In the embodiment as illustrated, the chuck 228 is coupled to an imprint head 230, such that the chuck 228, the imprint head 230, or both are configured to facilitate movement of the template 218 and the substrate 100 relative to each other. The imprint head 230 is coupled to a frame 250.

The system 210 can further include a fluid dispense system 232. The fluid dispense system 232 is used to deposit a formable material 234 on the substrate 100. In a particular embodiment, the formable material can be a polymerizable material. In the embodiment as illustrated, the formable material 234 is positioned upon the substrate 100 using a technique, such as, drop dispense, spin-coating, dip coating, chemical vapor deposition (CVD), physical vapor deposition (PVD), thin film deposition, thick film deposition, or any combination thereof. The formable material 234 is disposed upon the substrate 100 before, after, or both before and after a desired volume is defined between the patterning surface 222 and the substrate 100, depending on design considerations.

The system 210 further includes an energy source 238 coupled to direct energy 240 along a path 242. The imprint head 230 and the stage 216 can be configured to position the template 218 and the substrate 100 in superimposition with the path 242. In the embodiment as illustrated, the system 210 is controlled at least in part by a processor 254 in communication with the stage 216, the imprint head 230, the fluid dispense system 232, source 238, or any combination thereof, and may operate on a computer readable program stored in a memory 256.

Figure 3:
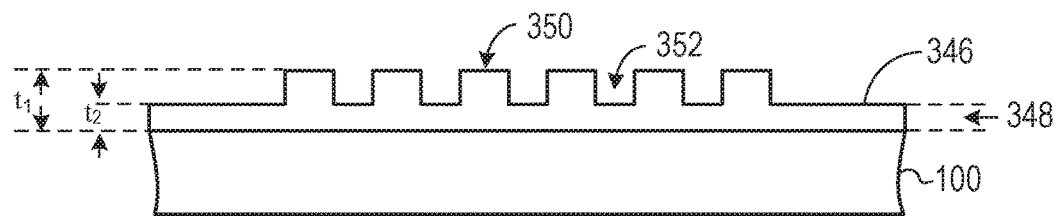
FIG. 3 includes an illustration of a cross-sectional view of a portion of a patterned layer formed by the imprint apparatus in FIG. 2.

Referring to FIGS. 2 and 3, the imprint head 230, the stage 216, or both can vary a distance between the mold 220 and the substrate 100 to define a desired volume therebetween that is filled by the formable material 234. For example, the imprint head 230 applies a force to the template 218 such that the mold 220 contacts the formable material 234. After the desired volume is filled with the formable material 234, the source 238 produces energy 240, e.g., ultraviolet radiation, causing the formable material 234 to solidify, cross-link, or the like so that the exposed formable material 234 conforms to a shape of the surface 244 of substrate 100 and the patterning surface 222 of the mold 220, defining the corresponding patterned layer 346 on the substrate 100. The patterned layer 346 may include a residual layer 348 and a plurality of features illustrated as protrusions 350 and recessions 352, with the protrusions 350 having a thickness $t_1$ and the residual layer 348 having a thickness $t_2$.

Figure 4:
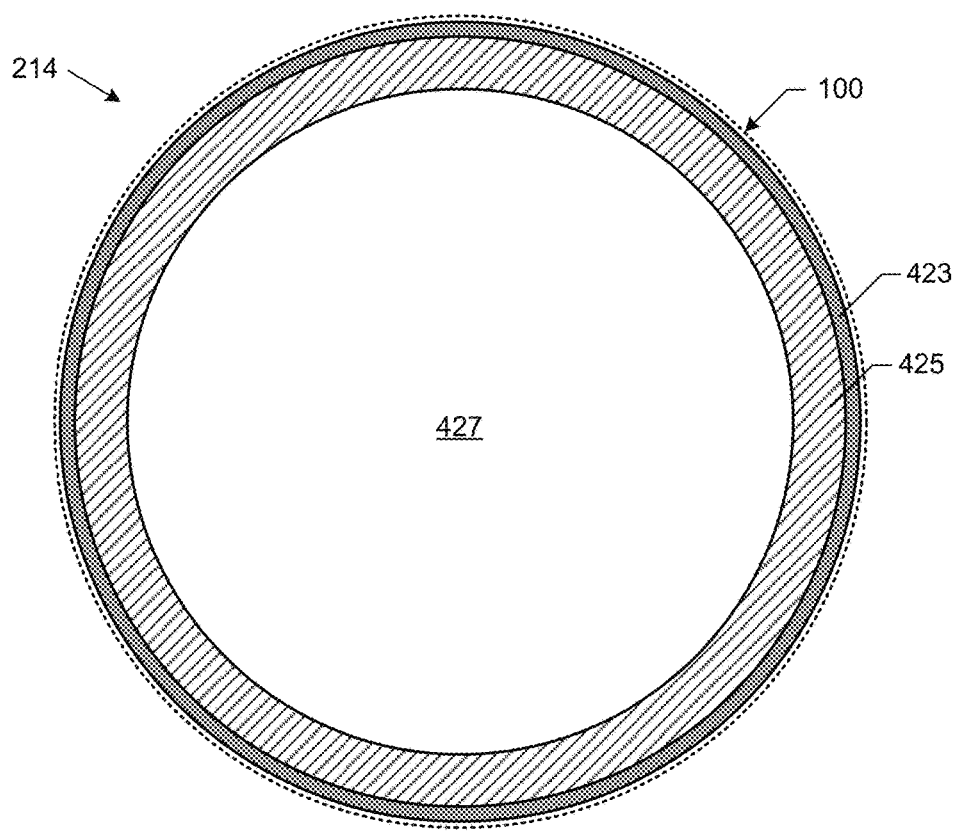
FIGS. 4 and 5 include illustrations of a top view and a cross-sectional view of a substrate overlying a chucking region having different zones.
Figure 5:
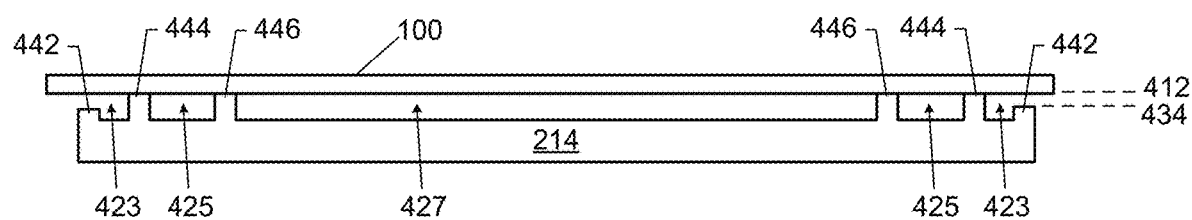

FIGS. 4 and 5 include illustrations of a portion of the substrate holder 214 that includes a chucking region and the substrate 100 to illustrate positional relationships between the chucking region and the substrate 100. The chucking region includes an outer zone 423, an intermediate zone 425, and a central zone 427, wherein the intermediate zone 425 is disposed between the outer zone 423 and the central zone 427. Each of the zones 423, 425, and 427 is defined in part by a recessed land 442 and full-height lands 444 and 426. The lands 442, 444, and 446 are not illustrated in FIG. 4 to simply understanding of the relations between the substrate 100 and the zones 423, 425, and 427. In a particular embodiment, each of the lands 442, 444, and 446 are continuous, and thus, the lands 442, 444, and 446 are concentric. The outer zone 423 is laterally defined by the lands 442 and 444, the intermediate zone 425 is laterally defined by the lands 444 and 446, and the central zone 427 is laterally defined by the land 446. Within any one or more of zones 423, 425, and 427, one or more pins (not illustrated) may be present to assist with support of the substrate 100, if needed or desired.

In the embodiment as illustrated, the substrate 100 may or may not extend beyond the chucking region of the substrate holder 214. As will be described in more detail during operation of the apparatus 210, the substrate 100 will have its edge modulated during initial contact between the formable material 234 and the patterning surface 222 of the mold 220. Such modulation may be achieved by using a vacuum pressure within the outer zone 423, and accordingly, the substrate 100 extends over the outer zone 423. In an embodiment, the substrate 100 extends over the land 442 and, in a particular embodiment, overhangs beyond the land 442. In an embodiment, the fraction of the substrate area that overhangs beyond the land 442 is at least 0.05%, at least 0.09%, or at least 1.2%, and in another embodiment, the fraction of the substrate area overhanging the land 442 is at most 11%, at most 8%, or at most 5%. In a particular embodiment, the fraction of the substrate area that overhangs beyond the land 442 is in a range of 0.05% to 11%, 0.09% to 8% or 1.2% to 5%.

In an embodiment, the area of the outer zone 423 is at least 0.5%, at least 1.1%, or at least 2% of the area of the substrate 100, and in another embodiment, the area of the outer zone 423 is at most 20%, at most 15% or at most 10% of the area of the substrate 100. In a particular embodiment, the area of the outer zone 423 is in a range of 0.5% to 18%, 1.1% to 14%, or 2% to 10% of the area of the substrate 100. In an embodiment, the area of the intermediate zone 425 is at least 5%, at least 11%, or at least 15% of the area of the substrate 100, and in another embodiment, the area of the intermediate zone 425 is at most 50%, at most 40% or at most 30% of the area of the substrate 100. In a particular embodiment, the area of the intermediate zone 425 is in a range of 5% to 50%, 11% to 40%, or 15% to 30% of the area of the substrate 100. In an embodiment, the area of the central zone 427 is at least 40%, at least 50%, or at least 60% of the area of the substrate 100, and in another embodiment, the area of the central zone 427 is at most 94%, at most 85% or at most 75% of the area of the substrate 100. In a particular embodiment, the area of the central zone 427 is in a range of 40% to 94%, 50% to 80%, or 60% to 70% of the area of the substrate 100.

The size of the zones may be expressed in dimensions rather than on a relative basis. In a particular example, the substrate 100 has a diameter of 300 mm and the zones 423, 425, and 427 are concentric. The widths of zones are measured as a distance between the corresponding lands for each zone. In an embodiment, the outer zone 423 has a width of at least 0.5 mm, or at least 1.1 mm, or at least 2 mm, and in another embodiment, the outer zone 423 is has width of at most 30 mm, at most 25 mm, or at most 20 mm. In a particular embodiment, the outer zone 423 has a width in a range of 0.5 mm to 30 mm, 1.1 mm to 25 mm, or 2 mm to 20 mm.

In an embodiment, the intermediate zone 425 has a width of at least 5 mm, at least 15 mm, or at least 25 mm, and in another embodiment, the intermediate zone 425 has a width of at most 95 mm, at most 80 mm, or at most 65 mm. In a particular embodiment, the intermediate zone 425 has a width in a range of 5 mm to 95 mm, 15 mm to 75 mm, or 25 mm to 65 mm from the centerpoint of the substrate 100.

In an embodiment, the central zone 427 has a width (e.g., a diameter when implemented in circular form) of at least 190 mm, at least 205 mm, or at least 220 mm, and in another embodiment, the central zone 427 has a width of at most 290 mm, at most 275 mm, or at most 260 mm. In a particular embodiment, the central zone 427 has a width in a range of 190 mm to 290 mm, 205 mm to 275 mm, or 220 mm to 260 mm.

Referring to FIG. 5, the top surfaces of the full-height lands 444 and 446 define a primary surface 412 of the chucking region. At least zones 425 and 427 extend to an exposed surface of the substrate holder 214 within the chucking region. The recessed land 442 has a top surface that lies at an elevation 434 lower than the primary surface 412. The recessed land 442 allows the substrate 100 to achieve a desire convex profile as will be described later in this specification. In an embodiment, the elevation difference between the elevation 434 of the top surface of the recessed land 442 and the primary surface 412 is at least 0.5 micron, at least 1.1 microns, or at least 1.5 microns, and in another embodiment is no greater than 10 microns, no greater than 8 microns, or no greater than 6 microns. In a particular embodiment, the elevational difference is in a range of 0.5 micron to 10 microns, 1.5 microns to 8 microns, or 3 microns to 6 microns. In another embodiment, the recessed land 442 can be replaced with a full-height land, just like full-height lands 444 and 446. Such an embodiment is described later in this specification.

Figure 6:
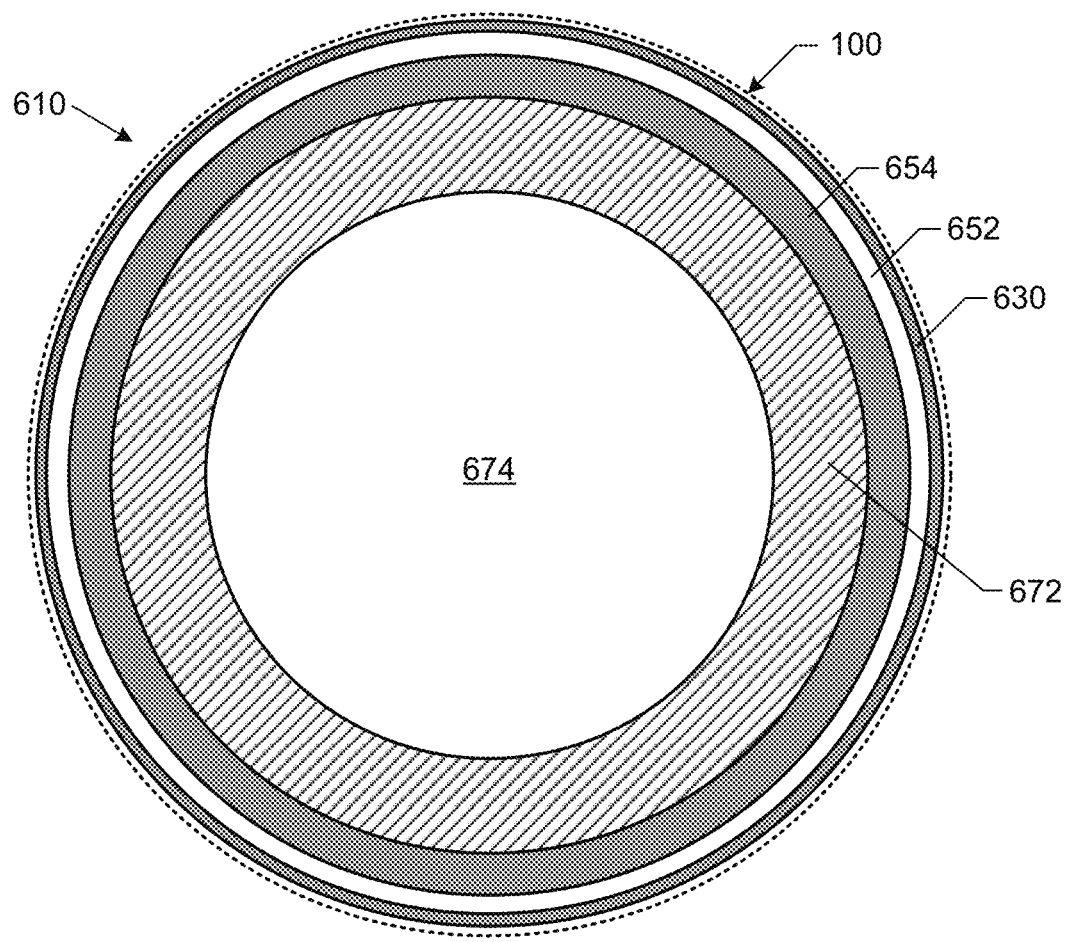
FIG. 6 includes an illustration of a top view of a workpiece overlying a chucking region having more zones as compared to the embodiment illustrated in FIG. 4.

More zones may be used within the chucking region. In another embodiment, a substrate holder 610 includes zones 630, 652, 654, 672, and 674 as illustrated in FIG. 6. In a further embodiment, any zone may be divided into rows, columns, or as a matrix of pixels. As the number of zones or division of any one or more zone increases, control over the substrate may improve; however, such control may be accompanied by further complexity with the manufacture of the substrate holder, a control system (e.g., gas controller 236), or the like. After reading this specification, skilled artisans will be able to determine a design for the substrate holder and control system that meets the needs or desires for a particular application.

Figure 7:
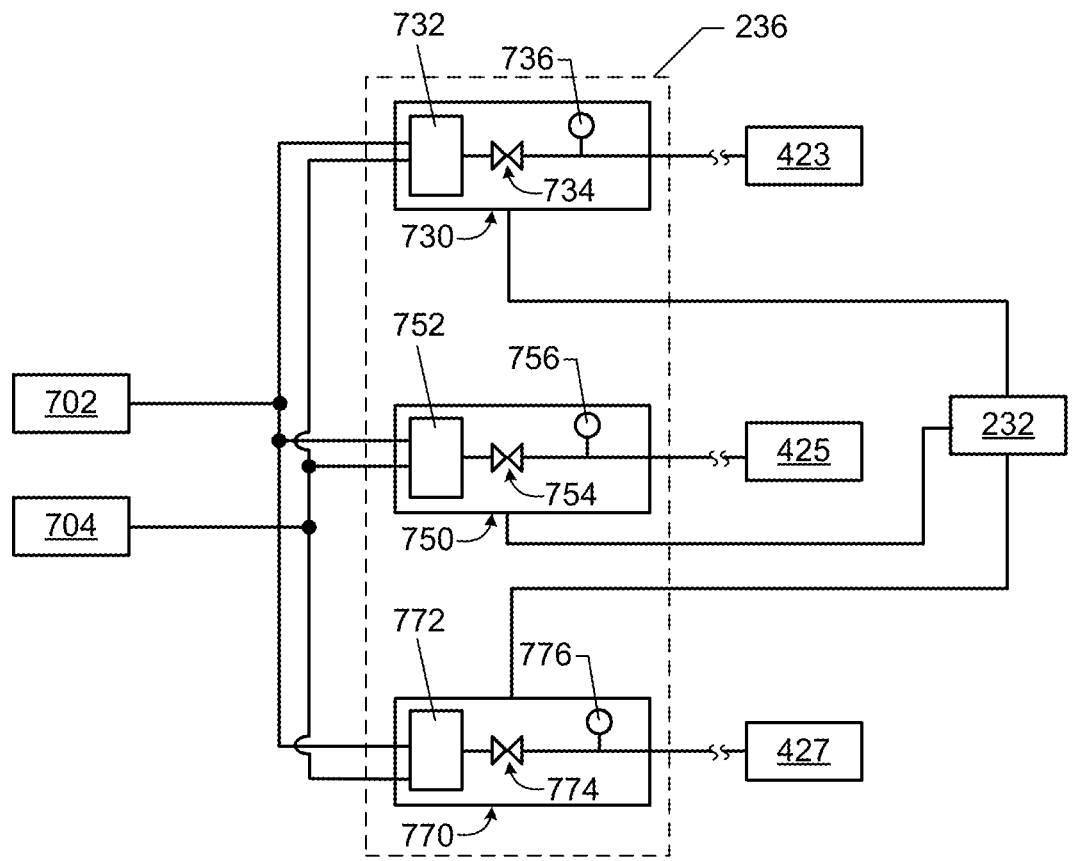
FIG. 7 includes a depiction of a gas flow controller in relationship to pressure sources, zones within a template holder, and a processor.

The zones 423, 425, and 427 are in fluid communication with the gas controller 236, as illustrated in FIG. 7. The gas controller 236 is in fluid communication with a vacuum (negative) pressure source 702 and a positive pressure source 704. The gas controller 236 includes control units 730, 750, and 770 that include a pressure source selector 732, 752, and 772, a valve or other pressure control mechanism 734, 754, and 774, and a pressure sensor 736, 756, and 776. The gas controller 236 is coupled to the processor 232. Logic for operating the gas controller 236 may be within gas controller 236, the processor 232, or both. In a particular embodiment, the zone 423 may be set to a vacuum pressure set point, and the zone 425 may be set to a positive pressure set point. The pressure source selector 732 can select the vacuum pressure source 702, and the valve 734 will be adjusted so that the pressure as sensed by the pressure sensor 736 is the same as or within a predetermined tolerance of the pressure set point. The pressure source selector 752 can select the positive pressure source 704, and the valve 754 will be adjusted so that the pressure as sensed by the pressure sensor 756 is the same as or within a predetermined tolerance of the pressure set point. Values for the pressures are described in more detail later in this specification.

Figure 8:
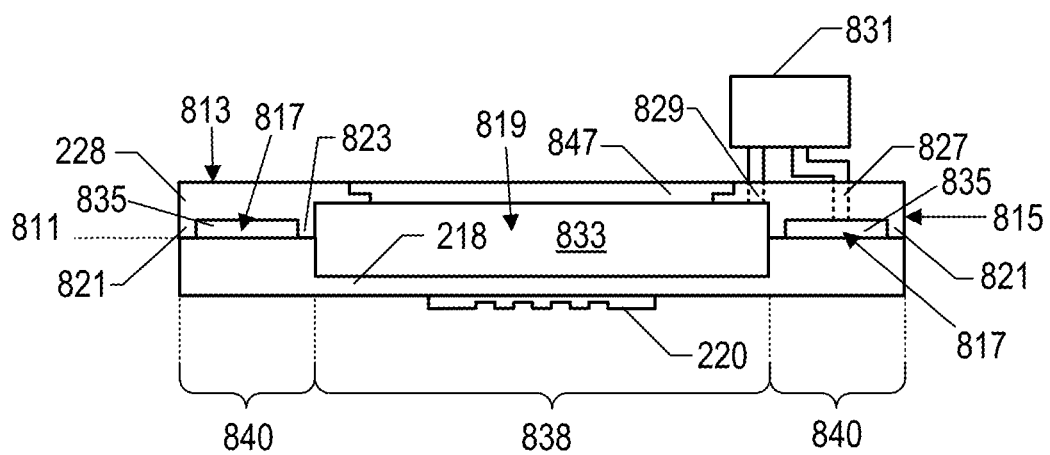
FIG. 8 includes an illustration of a cross-sectional view of a portion of a template including lands and zones.

Referring to FIGS. 2 and 8, the template 218 is coupled to the template chuck 228. The template chuck 228 includes opposed sides 811 and 813. A side, or edge, surface 815 extends between the first and second sides 811 and 813. The first side 811 includes a recess 817 and a recess 819, spaced apart from the recess 817, defining spaced-apart support regions 821 and 823. The support region 821 cinctures support region 823 and the recesses 817 and 819. The support region 823 cinctures the recess 819. In a further embodiment, support regions 821 and 823 are formed from a compliant material. In a particular embodiment, the support region 821 has a square shape, and the support region 823 has a circular shape; however, in a further embodiment, the support regions 821 and 823 can include any geometric shape desired. A portion 847 of template chuck 228 is in superimposition with the recess 819 and can be transparent to radiation having a predetermined wavelength or a range of wavelengths. The portion 847 can include a thin layer of transparent material, such as glass. However, the material of the portion 847 may depend upon the wavelength of radiation emitted by the energy source. The portion 847 extends between the side 813 and terminates proximate to the recess 819. The portion 847 has an area at least as large as an area of mold 220 so that mold 220 is in superimposition therewith.

The template chuck 228 includes throughways 827 and 829. In an alternative embodiment, the template chuck 228 may have a different number of throughways. The throughway 827 places the recess 817 in fluid communication with the surface 813, however, in a further embodiment, the throughway 827 places the recess 817 in fluid communication with any surface of template chuck 228. The throughway 829 places the recess 819 in fluid communication with the side 813, however, in a further embodiment, the throughway 829 places the recess 819 in fluid communication with any surface of template chuck 228. The throughways 827 and 829 can facilitate placing the recesses 817 and 819, respectively, in fluid communication with a pressure control system, such as a pump system 831.

The pump system 831 may include one or more pumps to control the pressure proximate to the recesses 817 and 819. To that end, when the template 218 is coupled to the template chuck 228, the template 218 rests against the support regions 821 and 823, covering the recesses 817 and 819. A flexible region 838 of the template 218 may be in superimposition with the recess 819, defining a chamber 833 and a thicker region 840 of the template 218 may be in superimposition with recess 817, defining a chamber 835. The pump system 831 operates to control a pressure in the chambers 833 and 835.

Figure 9:
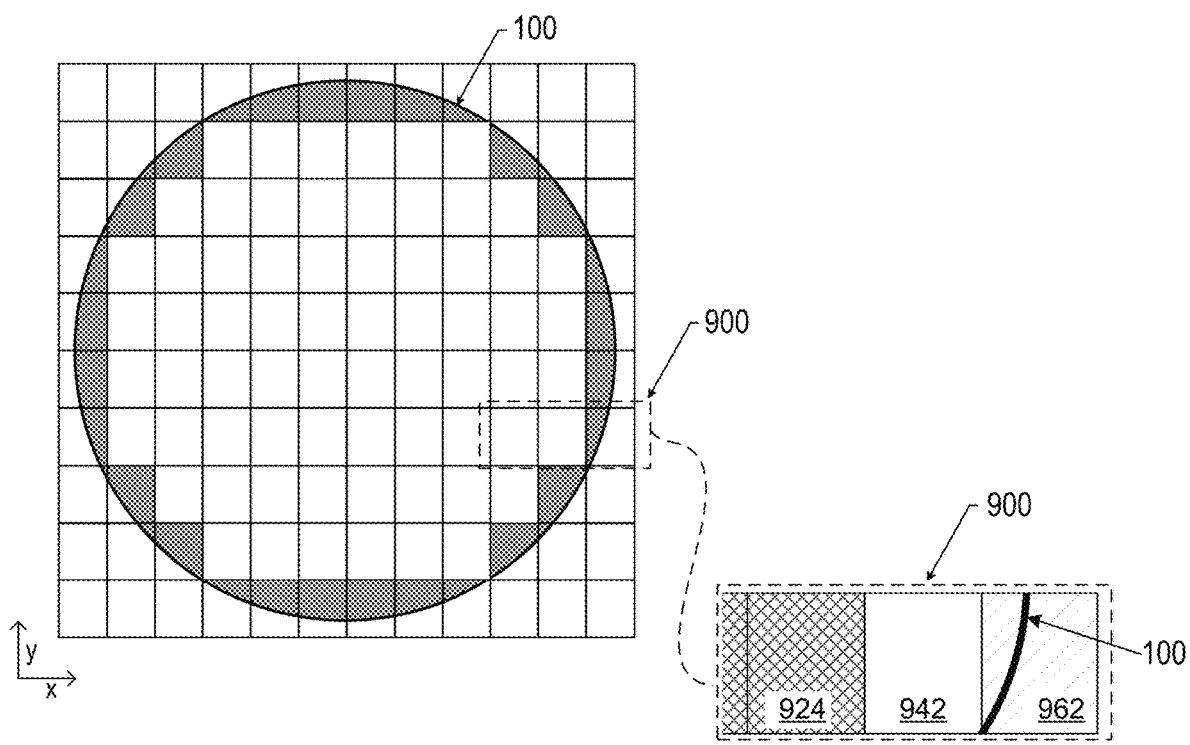
FIG. 9 includes illustrations of plan views of a substrate include imprinting fields and an enlarged portion of such substrate and imprinting fields.
Figure 10:
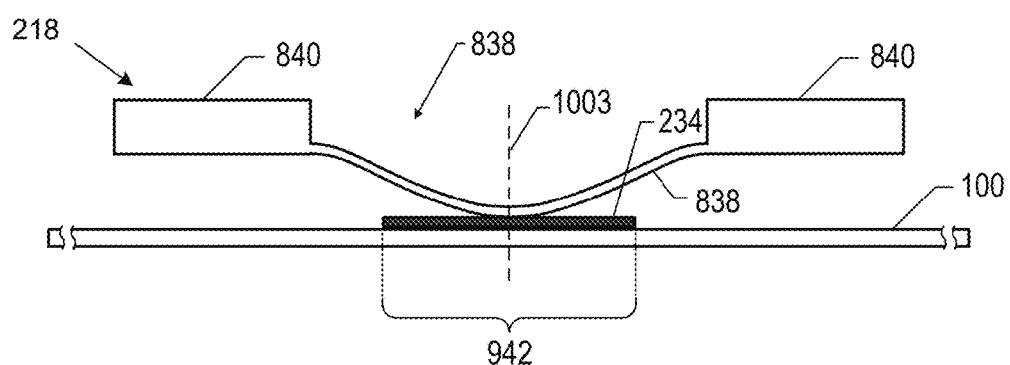
FIG. 10 includes an illustration of a cross-sectional view of a portion of a template and a workpiece when imprinting a full field at initial contact between the template and a formable material.

FIG. 9 includes an illustration of a top view of a portion of the substrate 100 during a patterning sequence. The difference between full fields and partial fields, as previously described, will become more apparent during the patterning sequence. Field 924 is a full field and has the formable material already patterned. In a particular embodiment, the formable material is a polymerizable layer that has been polymerized when in contact with the mold 220. A field 942 is a full field, and a field 962 is a partial field, and a <50% partial field in particular. The fields 942 and 962 may include the formable material 234 that is not yet patterned. FIG. 10 illustrates the template 218 that includes the region 838 that can flex and the region 840 that is coupled to the template chuck 228 (not illustrated in FIG. 10). Referring to FIGS. 8 and 10, the chamber 835 can be at a vacuum pressure, and the chamber 833 can be at a positive pressure to achieve the shape as illustrated in FIG. 10. After reading this specification, skilled artisans will understand that the illustration in FIG. 10 accentuates the shape to improve understanding the concepts, and in practice, the shape may not be as accentuated. Furthermore, the mold 220 is not illustrated in FIG. 10 to simplify understanding of the concepts described herein.

As illustrated in FIG. 10, initial contact (designated by dashed line 1003) between the template 218 and the formable material 234 within the field 942 is near the geometric center of the field 942. After initial contact, the template 218 and substrate 100 are moved closer together, and the contact between the template 218 and the formable material 234 increases and causes the formable material 234 to flow along the substrate 100 and within the recesses (not illustrated in FIG. 10) within the template 218. Pressures within the chamber 833 may stay the same or become closer to atmospheric pressure as the distance between the template 218 and substrate 100 is reduced. At this time, the chambers 833 and 835 can be taken to the pressures used during exposure. The formable material 234 is exposed to energy, such as ultraviolet radiation, to form a polymer layer, and the template 218 and substrate 100 are separated. After exposure, the field 942 is substantially identical to the field 924.

The partial field 962 has imprinting considerations that are significantly different than the full fields 924 and 942 because the partial field 962 has at least one surface dimension, for example, length or width of the partial field, that is smaller than the corresponding dimension of patterning surface of the template 218, where the patterning surface corresponds to a full field. As illustrated in FIG. 9, the x-dimension of the partial field 962 is smaller than the corresponding x-dimension of the imprint field of the template 218. The method regarding the partial field imprinting sequence is provided below in more detail.

Figure 11:
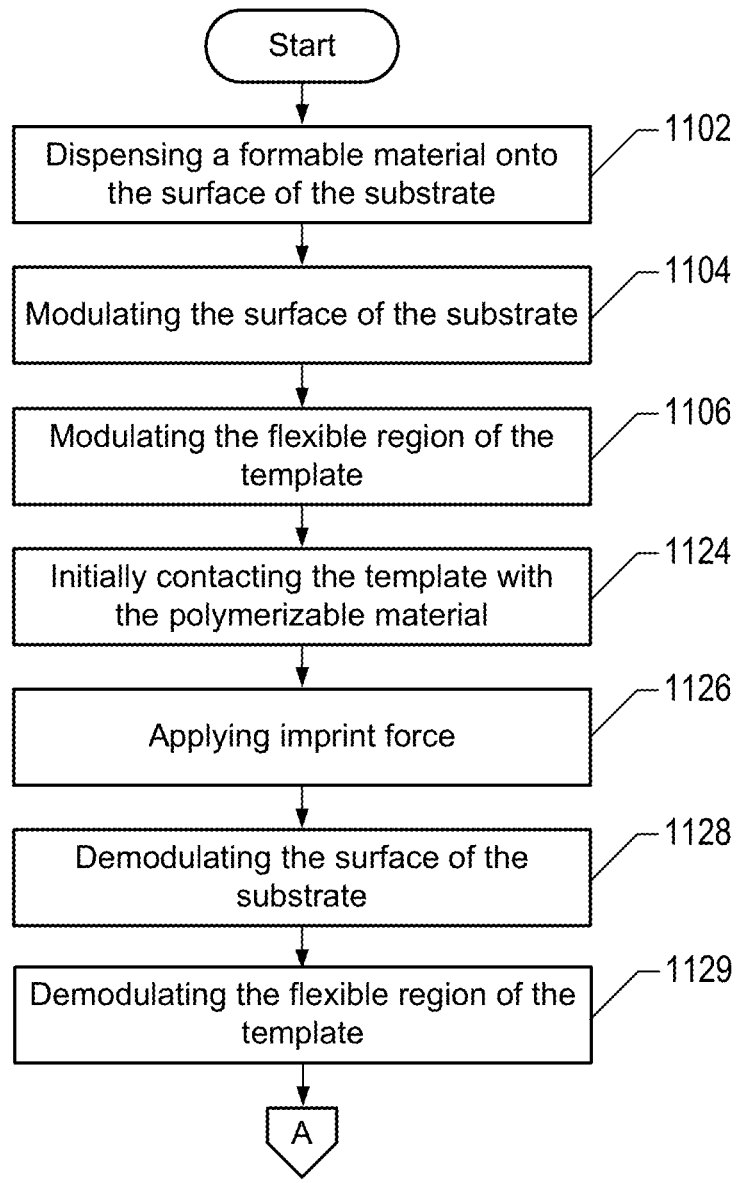
FIGS. 11 to 12 include a process flow for forming an imprinted layer for a partial field using an imprint apparatus.
Figure 12:
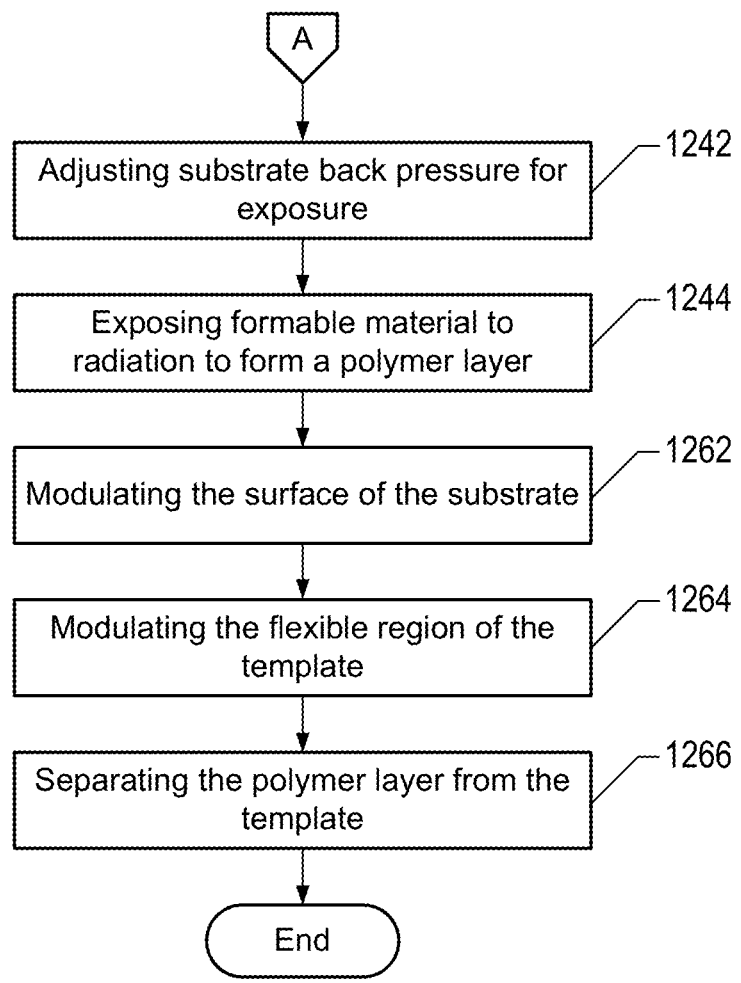

FIGS. 11 to 12 include an exemplary method in accordance with an embodiment. In another embodiment, more, fewer, or other actions may be performed without deviating from the concepts as described herein.

The method can include dispensing the formable material 234 onto the surface of the substrate 100, at block 1102 of FIG. 11. Referring to FIG. 2, the stage 216 is positioned relative to a print head or another similar outlet of the fluid dispense system 232. The formable material 234 may be dispensed before any fields are exposed or between exposing fields. The composition of the formable material 234 and the energy from the energy source 238 are matched so that the formable material 234 can be polymerized to form a polymer layer when exposed to the energy 238. The processor 254 provides signals that control the motion of the stage 216 and the fluid dispense system 232. In an embodiment, the fluid dispense system 232 dispenses the proper amounts of formable material 234 at predetermined locations. In a particular embodiment, the fluid dispense system 232 prints droplets at a predetermined areal density that corresponds to the density of recesses or mesas of a particular portion of the imprint field of the template 218. If needed or desired, the substrate 100 may be treated before the formable material 234 is dispensed in order to improve adhesion between (1) the substrate 100 and (2) formable the subsequently-formed polymer layer. Such a treatment may include a suitable adhesion promoting material.

Figure 13:
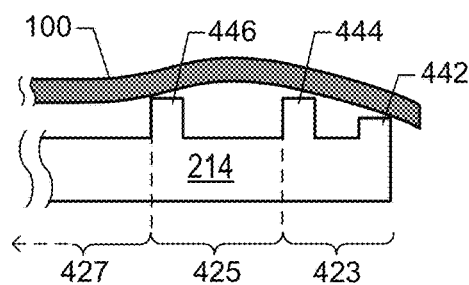
FIGS. 13 and 14 include illustrations of cross-sectional views of portions of a substrate and the substrate holder during a substrate modulation operation.

The method can further include modulating the surface of the substrate 100, at block 1104 of FIG. 11. The modulation causes the surface of the substrate 100, and hence, the surface of the workpiece, which includes the substrate 100 and the formable material 234, to become convex. FIG. 13 illustrates a portion of the substrate 100 and the substrate chuck 214. The formable material 234 is present over the substrate 100 but is not illustrated in FIG. 13 to simplify understanding of modulation of the substrate 100 with respect to the substrate chuck 214. In an embodiment, the full-height land 444 acts as a fulcrum, and the substrate 100 at the periphery bends downward. In a particular embodiment, the substrate 100 does not contact the recessed land 442.

Figure 14:
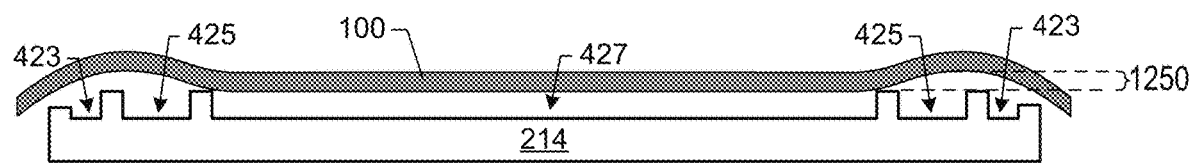

FIG. 14 includes an illustration of the substrate chuck 214 and substrate 100 during modulation. In zone 425, the substrate 100 is raised as compared to zones 423 and 427. In an embodiment, the maximum elevational difference 1250 between the primary surface of the substrate chuck 214 and a bottom surface of the substrate 100 within the intermediate zone 425 is at least 1.1 microns, at least 2 microns, or at least 3 microns, and in another embodiment is at most 50 microns, at most 40 microns, or at most 30 microns. In a particular embodiment, the maximum elevational difference 1250 is in a range of 1.1 microns to 50 microns, 2 microns to 40 microns, or 3 microns to 30 microns.

Referring to FIG. 2, the processor 254 sends signals to the gas controller 236 to adjust the pressures within the zones 423, 425, and 427 (FIG. 4). During modulation, the zones 423 and 427 can be at vacuum pressure, and the zone 425 can be at positive pressure. Referring to FIG. 7, within the control unit 730, the pressure source selector 732 selects the vacuum pressure source 702 and adjusts the valve 734 so that the pressure as sensed by the pressure sensor 736 is at a vacuum pressure set point or within a predetermined tolerance of the vacuum pressure set point. In an embodiment, the pressure within the zone 423 is at least −2 kPa, at least −11 kPa, or at least −20 kPa, and in another embodiment, the pressure within the zone 423 is at most −100 kPa, or at most −80 kPa. In a particular embodiment, the pressure within the zone 423 is in a range of −2 kPa to −100 kPa, −11 kPa to −100 kPa, or −20 kPa to −80 kPa.

Within the control unit 750, the pressure source selector 752 selects the positive pressure source 704 and adjusts the valve 754 so that the pressure as sensed by the pressure sensor 756 is at a positive pressure set point or within a predetermined tolerance of the positive pressure set point. In an embodiment, the pressure within the gas zone 425 is at least 0.0 kPa, at least 1.1 kPa, or at least 3 kPa, and in another embodiment, the pressure within the zone 425 is at most 20 kPa, at most 18 kPa, or at most 16 kPa. In a particular embodiment, the pressure within the zone 425 is in a range of 0.0 kPa to 20 kPa, 1.1 kPa to 18 kPa, or 3 kPa to 16 kPa. In another embodiment, the zone 425 may have a narrower width and may be able to use a pressure of 150 kPa, possibly even higher, as the pressure may depend on the channel geometry.

Within the control unit 770, the pressure source selector 772 selects the vacuum pressure source 702 and adjusts the valve 774 so that the pressure as sensed by the pressure sensor 776 is at a vacuum pressure set point or within a predetermined tolerance of the vacuum pressure set point. In an embodiment, the pressure within the zone 427 is at least −2 kPa, at least −11 kPa, or at least −20 kPa, and in another embodiment, the pressure within the zone 427 is at most −100 kPa, or at most −80 kPa. In a particular embodiment, the pressure within the zone 427 is in a range of −2 kPa to −100 kPa, −11 kPa to −100 kPa, or −20 kPa to −80 kPa.

The process can further include modulating the flexible region of the template 218, at block 1106. Pressure within the chamber 833 can be taken to a pressure as previously described to provide a convex shape for the imprint field of the template 218. The processor 254 can send signals to the pump system 831 to change the pressure.

The processing operations described in blocks 1102, 1104, and 1106 may be performed in any order or simultaneously. For example, the formable material 234 can be dispensed while the substrate 100 is being modulated. After reading this specification, skilled artisans can perform the operations in the order that meets their needs or desires for a particular application.

Figure 15:
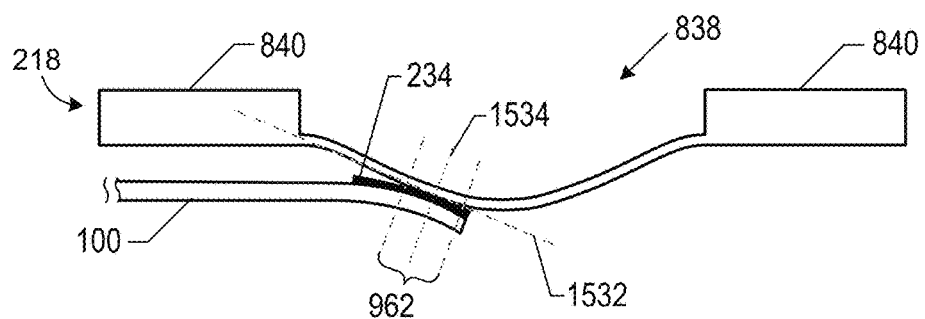
FIG. 15 includes an illustration of a cross-sectional view of a portion of a template and a workpiece with modulation when imprinting a partial field at initial contact between the template and a formable material.

The method includes initially contacting the template 218 with the formable material that overlies the substrate 100. In an embodiment, the method includes initially contacting the template 218 with the formable material 234, at block 1124 in FIG. 11. The modulation helps to move the initial contact point further from the periphery of the substrate 100. In particular, the initial contact occurs at a location spaced apart from the periphery of the partial field 962, as illustrated in FIG. 15. Ideally, the initial contact is at the geometric center for all fields including the partial field 962, which is a <50% partial field. Even if the exact, precise location of geometric center cannot or is difficult for initial contact, being closer to the geometric center is better than being farther from the geometric center. For the partial field, the imprint field 962 is less than the size of the imprint field for a full field. The initial contact between the template 218 and the formable material 234 is at a location spaced apart from the periphery of both the substrate 100 and the formable material 224. Initial contact is illustrated by the dotted line 1534 in FIG. 15. The surfaces of the template 218 and substrate 100 are curved such that at the point of initial contact between the template 218 and the formable material 234, lies along a plane extending through the initial contact point (designated by dashed line 1532 in FIG. 15) and is tangent to both surfaces of the template 218 and the substrate 100.

The method includes applying imprint force, at block 1126. Applying the imprint force can be achieved by reducing the distance between the template 218 and substrate 100. As the distance decreases, the force increases. Referring to FIG. 2, the processor 254 can send signals to the imprint head 236, the stage 218, or both. This operation can be monitored using a pressure sensor within the template holder 228 and by measuring a distance between (1) the substrate 100 or the substrate holder 228 and (2) the template 218 or the template holder 228. Similar to the full field imprinting, additional contact between the template 218 and the formable material 234 extends in directions away from the initial contact. When the imprint force is applied, the formable material 234 spreads within the partial field 762. In an embodiment, the contact increases until the template 218 is in contact with the formable material 234 for substantially all of the partial field 962 with a possible exception at the peripheral edge of the substrate 100, as the side surface between major surfaces of the substrate 100 may be rounded, beveled, or the like.

The method further includes demodulating the surface of the substrate 100, at block 1128 in FIG. 11. Pressure within the zones 423 and 425 can be taken closer to atmospheric pressure, if not already at atmospheric pressure. The processor 254 can send signals to the gas controller 236 to change the pressure using the control units 730 and 750 (FIG. 7). Although not illustrated, the pressure source selectors 732 and 752 may also allow air within the imprint apparatus or another source to be fed to the zones 423 and 425. In another embodiment, the recessed land 442 can allow atmospheric pressure to be achieved in the zone 423 by deactivating the control unit 730 (for example, closing the valve 734). During demodulation, the convex shape near the periphery can be reduced or eliminated. The gas pressure within the zone 427 may or may not be changed during the demodulation.

The method further includes demodulating the template 218, at block 1129 in FIG. 11. Pressure within the throughway 827 and chamber 833 can be taken closer to atmospheric pressure. The processor 254 can send signals to the pump system 831 to change the pressure. During demodulation, the convex shape of the imprint field of the template 218 can be reduced or eliminated.

The method includes adjusting substrate back pressure, at block 1242 in FIG. 12. The application of back pressure may help with the overlay between an existing patterned feature (not illustrated) on the substrate 100 and the imprint field of the template 218. The zones 425 and 427 (FIG. 4) can be set to the appropriate pressure to achieve a desired overlay. Signals are sent from the processor 254 to the gas controller 236 (FIG. 2). Referring to FIG. 7, in a particular embodiment, the pressure source selectors 752 and 772 select the vacuum source 702, and the valves 754 and 774 are adjusted so that the pressures as detected by pressure sensors 756 and 776 are at the pressure set point or within a predetermined tolerance of the pressure set point. In an embodiment, the zones 425, 427, or both are at a pressure of at least −0.5 kPa, at least −2 kPa, or at least −5 kPa, and in another embodiment, the pressure is at most −80 kPa, at most −50 kPa, or at most −30 kPa. In a particular embodiment, the pressure is in a range of −0.5 kPa to −80 kPa, −2 kPa to −5 kPa, or −50 kPa −5 kPa to −30 kPa. The pressures within the zones 425 and 427 may be the same or different from each other. In an embodiment, the zone 423 is at atmospheric pressure. In another embodiment, the zone 423 may be at a slight positive pressure to counter the imprint force from the template 218. In an embodiment, the zone 423 is at a pressure at or near atmospheric pressure, such as is in a range of −1 kPa to 1 kPa. The gas controller 236 can send a signal back to the processor 254 that the proper back pressure for the substrate 100 is achieved.

The method can include exposing formable material 234 to radiation to form a polymer layer, at block 1244 in FIG. 12. After receiving the signal from the gas controller 236 that the proper back pressure for the substrate 100 is achieved and overlay is acceptable, the processor 254 can send a signal to the energy source 238 to emit energy. In a particular embodiment, the energy may be ultraviolet radiation. The energy is transmitted through the imprint field of the template 218 and reaches the formable material 234. The energy causes an activator within the formable material 234 to initiate a polymer reaction within the formable material 234 or causes cross-linking of the formable material 234 to form a polymer layer. In another embodiment (not illustrated), the energy source 238 may already be emitting radiation, and a shutter or similar mechanism can be used to regulate when the energy is transmitted to the template 218.

Referring to FIG. 12, the method can further include modulating the surface of the substrate 100, the template 218, or both, at blocks 1262 and 1264, and separating the polymer layer from the template 218, at block 1266. The modulating operation in blocks 1262 and 1264 are optional.

A concern after exposure can be separating the polymer layer from the template 218 without significantly damaging the pattern of the polymer layer, as significant lateral stress can be generated during separation. In an embodiment, the modulation can be performed to achieve the convex shape as previously described. When modulation is used, it can provide for a similar benefit as in initial contact and filling. More particularly, the last point of separation moves further away from the periphery. When the last point of separation is at or close to periphery, delamination and defect transfer to next adjacent field on the substrate 100 may occur. In another embodiment, the modulation may be performed to reduce the lateral stress that could otherwise damage features (projections) within the polymer layer when the template 218 is removed. In a further embodiment, the modulation can change as a function of separation distance between the template 218 and substrate 100. For example, the degree of modulation may increase as the separation distance increases to allow the polymer layer to be separated from the template 218 more readily. The modulation may change as a linear or non-linear function of a change in separation distance between the template 218 and substrate 100. The modulation can be achieved by adjusting the substrate back pressure using the gas controller 236 and zones 423, 425, and 427.

Figure 16:
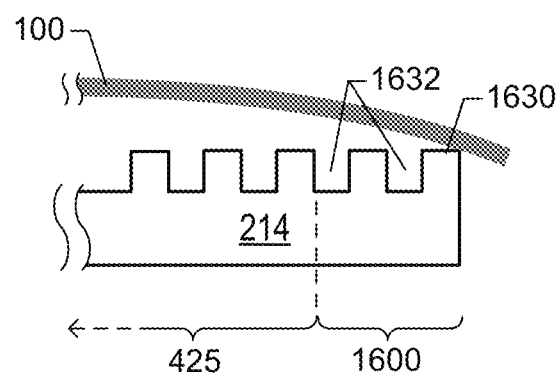
FIG. 16 includes an illustration of a cross-sectional view of portions of a substrate and the substrate holder during a substrate modulation operation using an imprint apparatus in accordance with an alternative embodiment.

Other embodiments of the imprint apparatus can be used. In another embodiment, the recessed land 442 (FIG. 5) can be replaced by full-height land, similar to full-height lands 444 and 446. FIG. 16 includes an illustration of a cross-sectional view of a portion of the substrate chuck 214 that has a modified outer zone 1600. The outer zone 1600 includes full-height lands 1630 and gas channels 1632. A fulcrum is at an outermost land 1630, whereas in previous embodiment, the fulcrum is at full-height land 444 (illustrated in FIG. 5). The substrate 100 can achieve a convex profile. With this embodiment, the outer land 1630 provides more support at wafer periphery (which can help overlay) and allows manufacture of the substrate chuck to be simplified. In this embodiment, the amount of gas leaking between the zones 425 and 1600 may be higher, as compared to zones 425 and 423 in FIG. 5. Thus, there could be more restrictions pressures within the zones 425 and 1600 to achieve the proper modulation and the proper convex shape with sufficient stability. Thus, the corresponding valve (for the zone 1600) within the control unit of the gas controller may need to open more than in an earlier embodiment to provide a stronger vacuum pressure during operation.

Figure 17:
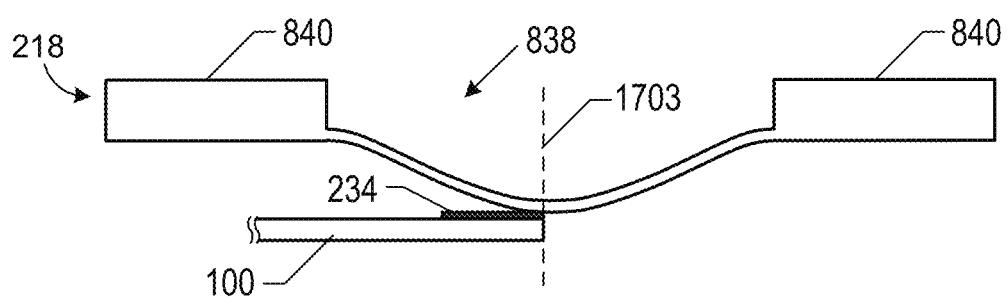
FIG. 17 includes an illustration of a cross-sectional view of a portion of a template and a workpiece without modulation when imprinting a partial field at initial contact between the template and a formable material.

Embodiments as described herein allow the formable material 234 within a partial field, and particularly, within a <50% partial field, to be spread in directions away from an initial contact point that is spaced apart from a peripheral edge of the partial field, and in a particular embodiment, closer to the geometric center of the partial field. Referring to FIG. 17, if the substrate 100 is not modulated, the initial contact (designated by dashed line 1703) with the template 218 can be at the peripheral edge of the partial field. Thus, initial contact is not spaced apart from the peripheral edge of the partial field, and imperfections in the spreading of the formable material 234 or direct contact between the substrate 100 and template 218 is more likely. Referring to FIG. 15, the concepts as described herein allow the initial contact to be within a partial field and can allow the formable material 234 to spread in more than one direction and more similar to full field imprinting and not have direct contact between the substrate 100 and the template 218.

Many different aspects and embodiments are possible. Some of those aspects and embodiments are described below. After reading this specification, skilled artisans will appreciate that those aspects and embodiments are only illustrative and do not limit the scope of the present invention. Exemplary embodiments may be in accordance with any one or more of the ones as listed below.

Embodiment 1. An imprint apparatus comprising
  a substrate holder including a chucking region and a recessed support section adjacent to a periphery of the chucking region, wherein the chucking region has a chucking region area; and
  a template holder having a template region for a template, wherein the template region has a template region area, wherein the chucking region area is larger than the template region area.

Embodiment 2. The imprint apparatus of Embodiment 1, further comprising a gas channel controller, wherein the substrate holder includes chucking gas channels extending to an exposed surface of the chucking region; and the gas channel controller is configured to adjust pressures within the chucking gas channels to induce a convex curvature of a partial field of a workpiece used with the imprint apparatus.

Embodiment 3. An imprint apparatus comprising:
  a substrate holder including a chucking region for a substrate and chucking gas channels extending to an exposed surface of the chucking region; and
  a gas channel controller that controls gas pressure within the chucking gas channels,
  wherein the gas channel controller is configured to adjust pressures within the chucking gas channels to induce a convex curvature of a partial field of a workpiece used with the imprint apparatus.

Embodiment 4. The imprint apparatus of Embodiment 3, further comprising a template holder for a template.

Embodiment 5. The imprint apparatus of any one of Embodiments 2 to 4, wherein the gas channel controller is configured to apply simultaneously a vacuum pressure within each of the chucking gas channels to at least part of the chucking region.

Embodiment 6. The imprint apparatus of any one of Embodiments 1, 2, 4, and 5, wherein the template holder further comprises a template gas channel configured to induce a convex curvature of the template.

Embodiment 7. The imprint apparatus of any one of Embodiments 3 to 6, wherein the substrate holder further includes a recessed land adjacent to a periphery of the chucking region.

Embodiment 8. The imprint apparatus of any one of Embodiments 2 to 7, wherein, during an initial contact of the template with a formable material within the partial field, the gas controller is further configured to apply a template backside pressure to the template.

Embodiment 9. The imprint apparatus of Embodiment 8, wherein, after the initial contact of the template with the formable material within the partial field, the gas controller is further configured to reduce the template backside pressure.

Embodiment 10. The imprint apparatus of any one of Embodiments 2 to 9, wherein:
  the gas controller is further configured to apply a first pressure to an outer zone of the chucking region, and apply a second pressure to an intermediate zone of the chucking region, wherein the first pressure is a vacuum pressure, and the second pressure is a positive gauge pressure.

Embodiment 11. The imprint apparatus of Embodiment 10, wherein, during the initial contact of the template with the formable material within the partial field, the gas controller is further configured to apply the first pressure and apply the second pressure simultaneously.

Embodiment 12. The imprint apparatus of Embodiment 10 or 11, wherein, after the initial contact of the template with the formable material within the partial field, the gas controller is configured to apply a third pressure to the outer zone of the chucking region, and apply a fourth pressure to the intermediate zone of the chucking region, wherein:
  the third pressure is different from the first pressure;
  the fourth pressure is different from the second pressure; or
  both.

Embodiment 13. The imprint apparatus of any one of Embodiments 2 to 12, wherein, during an exposure of the formable material to ultraviolet radiation, the gas controller is further configured to apply a fifth pressure to the outer zone of the chucking region, and apply a sixth pressure to the intermediate zone of the chucking region, wherein:
  the fifth pressure is different from the third pressure;

the sixth pressure is different from the fourth pressure; or both.

Embodiment 14. The imprint apparatus of Embodiment 13, wherein:
the third pressure is closer to atmospheric pressure as compared to the first pressure;
the fourth pressure is closer to atmospheric pressure as compared to the second pressure; and
the sixth pressure is lower than the fourth pressure.

Embodiment 15. The imprint apparatus of Embodiment 13 or 14, wherein the fifth pressure is closer to atmospheric pressure as compared to the first pressure.

Embodiment 16. A method comprising:
providing a workpiece within an imprint apparatus, wherein the workpiece includes a substrate and a formable material overlying the substrate; and
contacting a template with the formable material within a partial field having a periphery, wherein contacting includes initially contacting the template with the formable material at a location spaced apart from the periphery of the partial field.

Embodiment 17. The method of Embodiment 16, wherein the imprint apparatus comprises a substrate holder including a chucking region, and providing the workpiece comprises placing the substrate over the chucking region.

Embodiment 18. The method of Embodiment 16 or 17, further comprising dispensing the formable material over the substrate, wherein different areas of the substrate have different areal densities of formable material.

Embodiment 19. The method of any one of Embodiments 16 to 18, further comprising spreading the formable material within the partial field after initially contacting the template with the formable material.

Embodiment 20. The method of any one of Embodiments 16 to 19, further comprising modulating the substrate to form a convex shape of the workpiece adjacent to a periphery of the substrate before contacting the template with the formable material.

Embodiment 21. The method of Embodiment 20, wherein modulating the substrate is performed after dispensing the formable material.

Embodiment 22. The method of Embodiment 20 or 21, further comprising demodulating the substrate to reduce or eliminate the convex shape after initially contacting the template with the formable material.

Embodiment 23. The method of any one of Embodiments 16 to 22, further comprising applying a template backside pressure to the template during initially contacting the template with the formable material.

Embodiment 24. The method of Embodiment 23, further comprising reducing the template backside pressure after initially contacting the template with the formable material.

Embodiment 25. The method of Embodiment 24, further comprising increasing the template backside pressure after the formable material is polymerized.

Embodiment 26. The method of any one of Embodiments 16 to 25, further comprising exposing the formable material to ultraviolet radiation to polymerize the formable material and form a polymer layer.

Embodiment 27. The method of Embodiment 26, wherein the imprint apparatus comprises a substrate holder including a chucking region; and the method comprises applying a first pressure to an outer zone of the chucking region, and applying a second pressure to an intermediate zone of the chucking region, wherein the first pressure is a vacuum pressure, and the second pressure is a positive gauge pressure.

Embodiment 28. The method of Embodiment 27, wherein applying the first pressure and applying the second pressure are performed simultaneously during initially contacting the template with the formable material.

Embodiment 29. The method of Embodiment 27 or 28, further comprising, after initially contacting the template with the formable material, applying a third pressure to the outer zone of the chucking region, and applying a fourth pressure to the intermediate zone of the chucking region, wherein the third pressure is different from the first pressure; the fourth pressure is different from the second pressure; or both.

Embodiment 30. The method of Embodiment 29, further comprising, during exposing the formable material to ultraviolet radiation, applying a fifth pressure to the outer zone of the chucking region, and applying a sixth pressure to the intermediate zone of the chucking region, wherein the fifth pressure is different from the third pressure; the sixth pressure is different from the fourth pressure; or both.

Embodiment 31. The method of Embodiment 30, wherein the third pressure is closer to atmospheric pressure as compared to the first pressure; the fourth pressure is closer to atmospheric pressure as compared to the second pressure; and the sixth pressure is lower than the fourth pressure.

Embodiment 32. The method of Embodiment 31, wherein the fifth pressure is closer to atmospheric pressure as compared to the first pressure.

Embodiment 33. The method of any one of Embodiments 26 to 32, further comprising separating the polymer layer from the template.

Embodiment 34. The method of Embodiment 33, further comprising modulating a shape of the substrate during separating to reduce lateral strain within the polymer layer, as compared to separating without modulating the shape of the substrate.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An imprint apparatus for performing an imprint process of contacting a template with an imprint material on a substrate and forming a pattern on the imprint material on the substrate, the apparatus comprising:
   a head configured to move the template;
   a substrate holder configured to hold the substrate by zones in a chucking region
   a gas controller that controls gas pressures within the zones; and
   a head controller configured to control the head, wherein the head controller controls the head so as to make the template contact the imprint material in a partial field at an edge of the substrate where only a portion of an imprint area of the template overlaps the partial field, the gas controller is configured to induce positive pressure within the zone corresponding to the partial field to induce a convex curvature of the partial field of the substrate.

2. The imprint apparatus of claim 1, wherein the substrate holder further includes a recessed land adjacent to a periphery of the chucking region.

3. The imprint apparatus of claim 1, wherein, during an initial contact of a template with the imprint material within the partial field, the gas controller is further configured to apply a template backside pressure to the template.

4. The imprint apparatus of claim 3, wherein, after the initial contact of the template with the imprint material within the partial field, the gas controller is further configured to reduce the template backside pressure.

5. The imprint apparatus of claim 1, wherein:
   the gas controller is configured to apply the positive pressure to intermediate first zone, wherein the first zone is the partial field, and apply a vacuum pressure to a second zone, wherein the second zone is interior to the first zone.

6. The imprint apparatus of claim 5, wherein, during the initial contact of the template with the imprint material within the partial field, the gas controller is further configured to apply the positive pressure and apply the vacuum pressure simultaneously.

7. The imprint apparatus of claim 5, wherein, after the initial contact of the template with the imprint material within the partial field, the gas controller is configured to apply a third pressure to the second zone of the chucking region, and apply a fourth pressure to the first zone of the chucking region, wherein:
   the third pressure is different from the first pressure;
   the fourth pressure is different from the second pressure; or
   both.

8. The imprint apparatus of claim 7, wherein, during an exposure of the formable material to ultraviolet radiation, the gas controller is further configured to apply a fifth pressure to the second zone of the chucking region, and apply a sixth pressure to the first zone of the chucking region, wherein:
   the fifth pressure is different from the third pressure;
   the sixth pressure is different from the fourth pressure; or
   both.

9. The imprint apparatus of claim 8, wherein:
   the third pressure is closer to atmospheric pressure as compared to the first pressure;
   the fourth pressure is closer to atmospheric pressure as compared to the second pressure; and
   the sixth pressure is lower than the fourth pressure.

10. The imprint apparatus of claim 8, wherein the fifth pressure is closer to atmospheric pressure as compared to the first pressure.

11. The imprint apparatus of claim 1, wherein the substrate holder comprises:
    an outer zone of the chucking region and a central zone of the chucking region, wherein the outer zone surrounds the central zone;
    a first land between the central zone and the outer zone; and
    a second land surrounding the outer zone, wherein the second land is recessed and lower than the first land.

12. The imprint apparatus of claim 1, wherein the zones further comprise an intermediate zone, wherein the intermediate zone is the partial field between a central zone and an outer zone, wherein the gas controller controls the gas pressure within the central zone, the outer zone, and the intermediate zone to induce a curvature of a portion of the substrate above the intermediate zone, wherein the portion of the substrate above the intermediate zone is higher than a portion of the substrate above either the central zone or the outer zone.

13. The imprint apparatus of claim 1, wherein the gas controller changes the pressure within the zone corresponding to the partial field to change the partial field from the convex curvature to an original state after the initial contact of the formable material within the partial field and the template.

14. The imprint apparatus of claim 1, wherein the chucking region is larger than the template.

* * * * *